United States Patent [19]
Behl et al.

[11] Patent Number: 5,673,029
[45] Date of Patent: Sep. 30, 1997

[54] APPARATUS FOR COOLING A MEMORY STORAGE DEVICE

[75] Inventors: Sunny Behl; Jack Friedman, both of San Jose, Calif.

[73] Assignee: Orbitron Computer System, Inc., Campbell, Calif.

[21] Appl. No.: 602,011

[22] Filed: Feb. 15, 1996

[51] Int. Cl.$^6$ .................................................. G08B 21/00
[52] U.S. Cl. .......................... 340/635; 340/584; 361/695; 454/184
[58] Field of Search ................................ 340/635, 584; 361/687, 694, 695; 454/184

[56] References Cited

U.S. PATENT DOCUMENTS

| | | | |
|---|---|---|---|
| 4,751,872 | 6/1988 | Lawson, Jr. | 361/695 |
| 5,121,291 | 6/1992 | Cope et al. | 361/695 |
| 5,171,183 | 12/1992 | Pollard et al. | 454/184 |
| 5,173,819 | 12/1992 | Takahashi et al. | 360/97.03 |
| 5,287,009 | 2/1994 | Heung | 261/695 |
| 5,414,591 | 5/1995 | Kimura et al. | 361/695 |
| 5,438,226 | 8/1995 | Kuchta | 361/695 |
| 5,493,457 | 2/1996 | Kawamura et al. | 369/75.1 |
| 5,511,055 | 4/1996 | Otsuki et al. | 369/79.1 |
| 5,547,272 | 8/1996 | Paterson et al. | 361/695 |

FOREIGN PATENT DOCUMENTS

295 19 526
U1   3/1996   Germany.

Primary Examiner—Jeffery Hofsass
Assistant Examiner—Daniel J. Wu
Attorney, Agent, or Firm—Kevin H. Fortin, Esq.

[57] ABSTRACT

Disclosed herein is an apparatus for cooling a memory storage device such as a hard disk drive. The apparatus includes a removable bezel and a bezel fan. The bezel mounts on a memory storage device housing having a memory storage device bay. The bezel covers the bay and cools the memory storage device. A memory storage device mounting kit having a frame can incorporate a bezel and a fan in a variation of this invention. The frame mounts a memory storage device within a memory storage device housing. The bezel attaches with the frame. The fan attaches with the bezel to direct air across a memory storage device and cool the memory storage device.

20 Claims, 7 Drawing Sheets

APPARATUS FOR COOLING A MEMORY STORAGE DEVICE

BACKGROUND OF THE INVENTION

1. Field of the Invention

The present invention generally relates to memory storage systems. More particularly, the present invention relates to an apparatus for cooling memory storage devices.

2. Previous Art

The demand for memory storage capacity continues to increase. Higher capacity memory storage devices are being developed to meet this demand. Although some users rely on the higher capacity memory storage devices to meet the user's memory storage needs, other users rely upon memory storage systems having multiple memory storage devices.

A typical memory storage system will include a housing with multiple memory storage device bays. Memory storage devices mount in the bays. Common memory storage devices include hard disk drives, optical drives, magnetic tape drives and floppy drives. Desk top computers, computer networks and disk arrays (e.g. RAID systems) generally rely upon any of various types of memory storage systems. High end memory storage systems may contain towers enclosing hundreds of memory storage devices.

Since the advent of hard disk drives, common hard disk drive capacities have increased substantially e.g. from 40 megabytes capacity to 1 or more gigabytes capacity. Presently, high end hard disk drives with 6–9 gigabytes and larger capacities are not uncommon. With such increased storage capacity, a specific piece of data may be difficult to locate on a hard disk. To locate data faster, many newer hard disk drives spin faster than older platters do. To spin the higher capacity disk drives faster, more powerful and reliable motors are required. It has been observed that the motors for high end hard disk drives generate more heat than the older and slower models might typically generate.

Heat within a memory storage housing may be problematic. The more active memory storage devices which are fit into a housing, the higher the housing temperature will be. Heat can reduce the life of electronic components, cause failure and reduce the reliability of a system. Since memory storage systems may loose valuable data during failure, the probability of failure is sought to be minimized.

Figure 1:
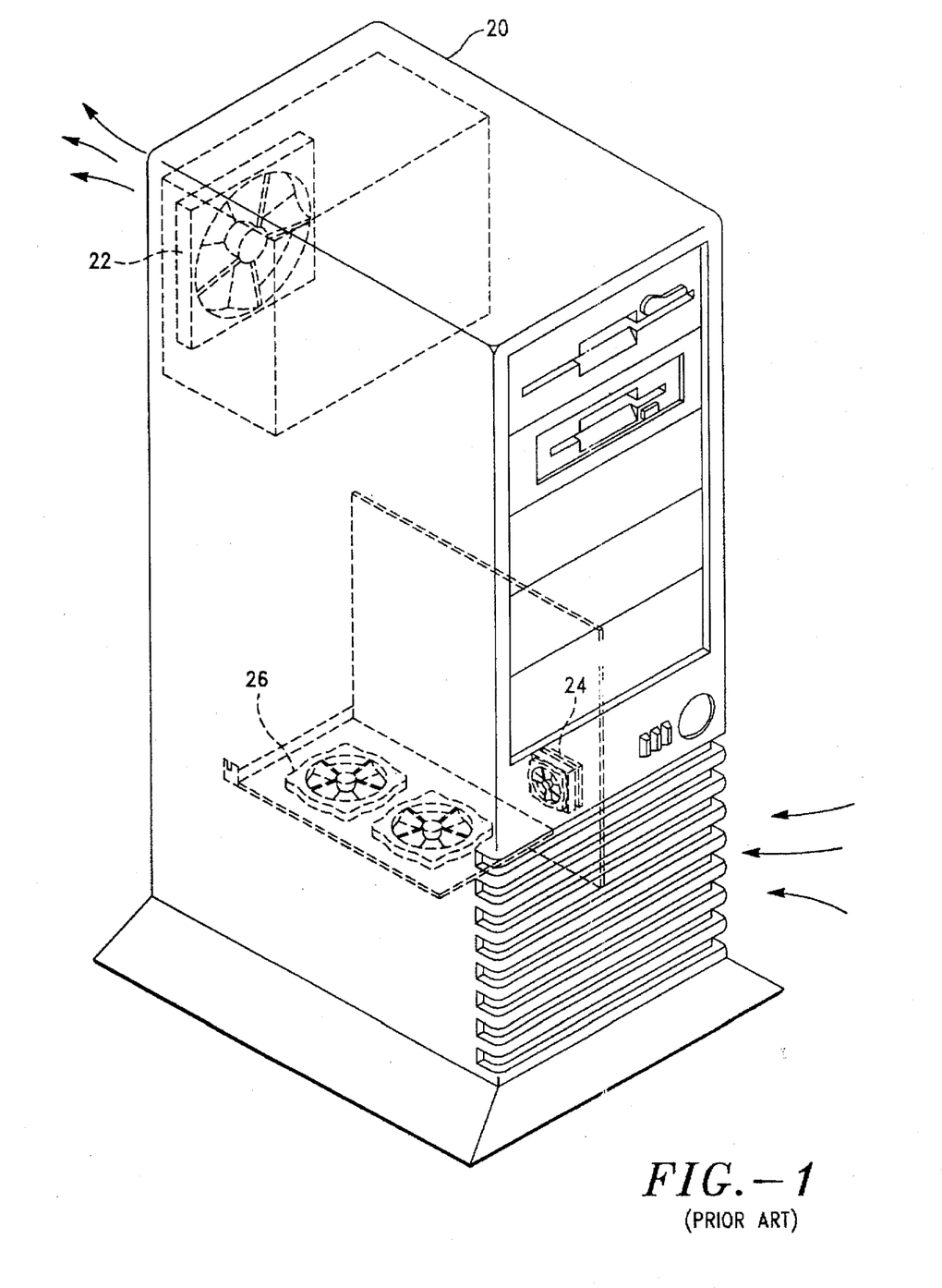
FIG. 1 is a perspective view a known memory storage device housing.

Several known ways to cool electronic components have been developed. A typical mini-tower computer housing 20 is shown in FIG. 1 having a power supply with an internal fan 22. The fan 22 pumps hot air from the housing and away from the power supply. Cool air is drawn through vents in the housing to replace the hot air pumped by the fan. This reduces the temperature of the power supply and the housing. Cooling the housing increase the useful life of the enclosed electronic components and particularly, the power supply.

The system shown in FIG. 1 also has a fan 24 mounted on the central processor. Since the central processor may generate as much heat as a small light bulb, fanning the processor reduces the temperature of the processor. Reducing the temperature of the processor improves the reliability and useful life of the processor and associated components. Unfortunately, the heat which dissipates from the processor may remain in housing.

The computer housing 20 includes a fan 26 mounted on a card. The card inserts into a device slot on the mother board. The fan circulates air within the housing to reduce the temperature of the hottest components. Unfortunately, the card mounted fan does not necessarily cause cool air to enter or cause heated air to exit the housing. In time, the housing interior may heat to an undesirable temperature.

With memory storage systems employing high end (>2 gigabytes) disk drives, the housings may heat to an undesirable temperature during use. Heat is also increased when the disk drives mount closely e.g. within 2 cm of each other. The heat may be so intense as to reduce the life expectancy and reliability of the hard disk drives. What is desired is a way to cool memory storage devices. What is also desired is a way to cool a memory storage device housing to increase the reliability and useful life of the electronic components contained therein.

Convective cooling may introduce contaminants such as dust into a memory storage device system. What is desired is a convective cooling system which minimizes the introduction of contaminants into a memory storage device system.

SUMMARY AND OBJECTS OF THE INVENTION

The various objects of the invention which are presented and which will become apparent below are presented by way of example only and are not intended to limit the scope of the present invention. The present invention is to be limited only by the appended claims.

It is an object of the present to provide an apparatus for cooling a memory storage system.

It is another object of the invention to provide an apparatus for increasing the reliability and life expectancy of electronic devices.

In accordance with the above objects of the invention and those which will be apparent below, the present invention includes a bezel connectable with the bay of a memory storage device housing, comprising:

a face having an area within the range of 2–10 in$^2$ for covering the memory storage device bay;

a fan a means for attaching a fan to the face;

whereby, when a fan mounts on the face and the bezel mounts on the housing, the fan circulates air through the housing to cool the housing.

In one embodiment, the bezel includes an air filter. The air filter covers a portion of the bezel. In a variation of this embodiment, the air filter removeably attaches over a portion of the bezel. In another variation of this embodiment, the air filter rotatably mounts on the bezel to selectively cover a portion of the bezel.

In another embodiment, the bezel has a face with an area within the range of 7–10 in$^2$ to cover a 5¼" memory storage device bay.

In another embodiment, the bezel has a face with an area within the range of 4–7 in$^2$ to cover a 3½" memory storage device bay.

It is an advantage of the present invention to provide a device for cooling a memory storage device.

It is an advantage of the present invention to regulate temperature and air quality in a memory storage system.

It is an advantage of the present invention to extend the life expectancy and reliability of electronic components.

BRIEF DESCRIPTION OF THE DRAWINGS

For a further understanding of the objects and advantages of the present invention, reference should be had to the following detailed description, taken in conjunction with the accompanying drawing, in which like parts are given like reference numerals and wherein.

DETAILED DESCRIPTION OF THE INVENTION

Figure 2:
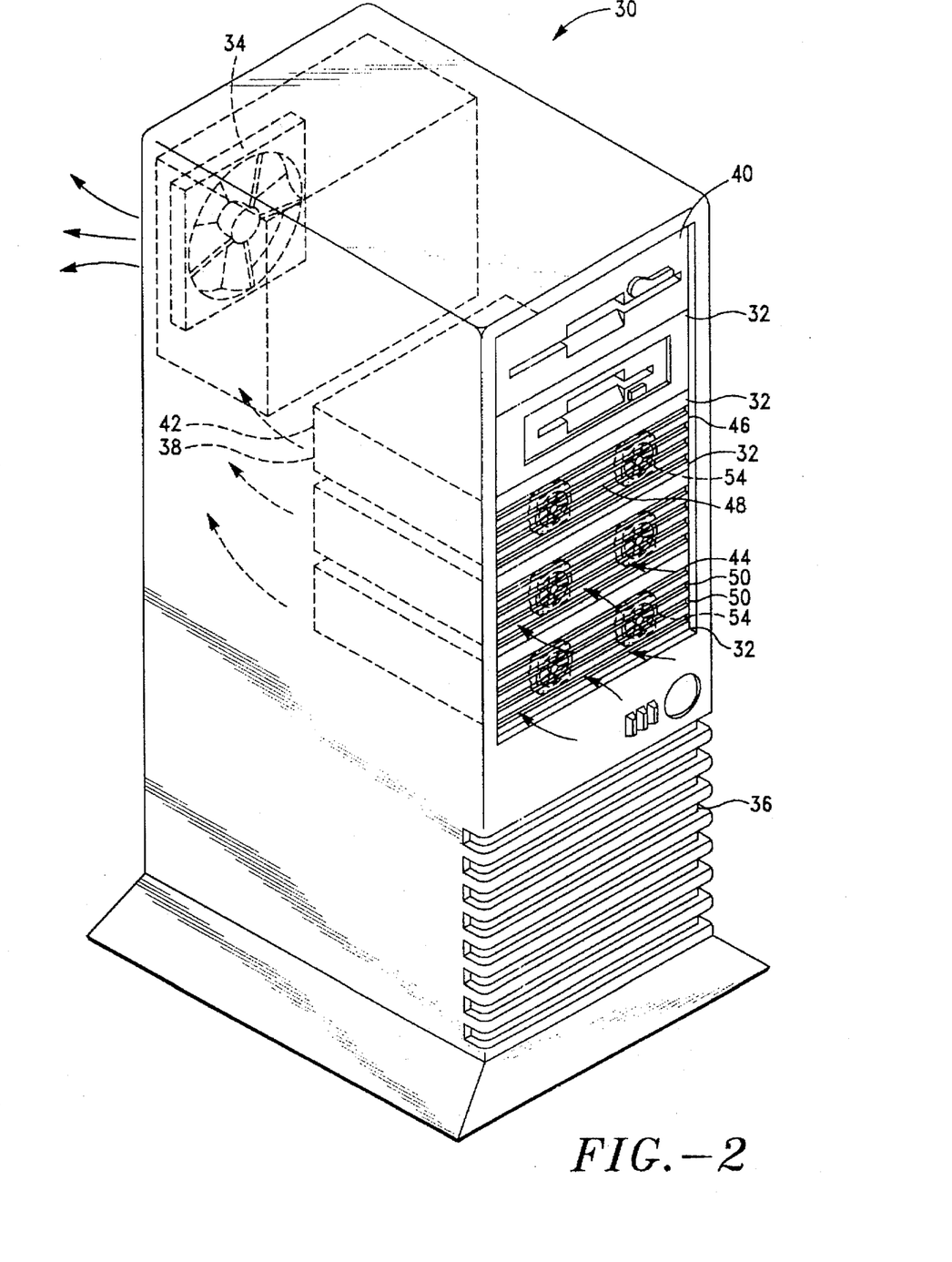
FIG. 2 is perspective view of a memory storage device housing in accordance with the present invention.

With particular reference to FIG. 2, there is shown a memory storage system having a memory storage device housing generally designated with the reference numeral 30. The housing 30 includes multiple memory storage device bays 32. The bays enable multiple memory storage devices to mount in the memory storage device housing.

The housing 10 includes a rear portion having a power supply exhaust fan 34 and a front portion which defines a plurality of vents 36. In the housing, various electrical components e.g. memory storage devices may heat air within the housing. The exhaust fan 34 draws the heated air out from within the housing 30. The vents 36 enable cool air to enter the housing 30.

Each memory storage device bay 32 has an opening for exposing memory storage devices 42. A hard disk drive 38 mounts on each of the three lower bays. A floppy disk drive 40 mounts in each of the two upper bays 32.

A bezel 44 mounts on the housing 30 over each bay 32 holding a hard disk drive 38. The bezel 44 covers the opening and the hard disk drive 38. The bezel 44 is made of a rigid material which protects any exposed portion of the memory storage device from impact. The bezel 44 is electrically non-conductive to minimize static electricity discharges.

The bezel 44 defines a periphery 46 and a face 48. The face 48 has an area within the range of 4–10 in$^2$ for covering the memory storage device bay. The face 48 includes a series of vents 50 which enable cool air to pass through the bezel, across the memory storage device 42 and into the housing 30.

A fan 54 mounts on the bezel 44. The fan 54 circulates air through the vents 50 to cool the memory storage device bay 32, the housing 30 and the memory storage device 42. The fan 54 draws air into the housing 50 and forces the air across the top and bottom of the memory storage device 42. Since the fan 54 mounts on the bezel 44, the fan 54 is in close proximity with the memory storage device 42 e.g. within several centimeters. The fan 54 is a standard 12 volt 0.09 amp brushless DC motor fan. The dimensions of the fan 54 are approximately 40 mm×40 mm×10 mm to enable the fan 54 to fit between the bezel 44 and the memory storage devise 42.

The close proximity of the fan 54 to the memory storage device 42 is important to maximize convective heat transfer from the memory storage device 42 while minimizing power consumption by the fan 54. This convective heat transfer cools the memory storage device 42 and typically increases memory storage device reliability and useful life.

The fan 54 increases the air pressure within the housing 30 so that heated air within the housing 30 will flow out from the housing 30. Outflow of heated air from the housing 30 reduces the temperature within the housing 30. Reduced housing temperature typically increases the reliability and useful life of all electrical components (including memory storage devices 42) within the housing 30. The housing vents 36 and the exhaust fan 34 facilitate outflow of heated air.

Figure 3:
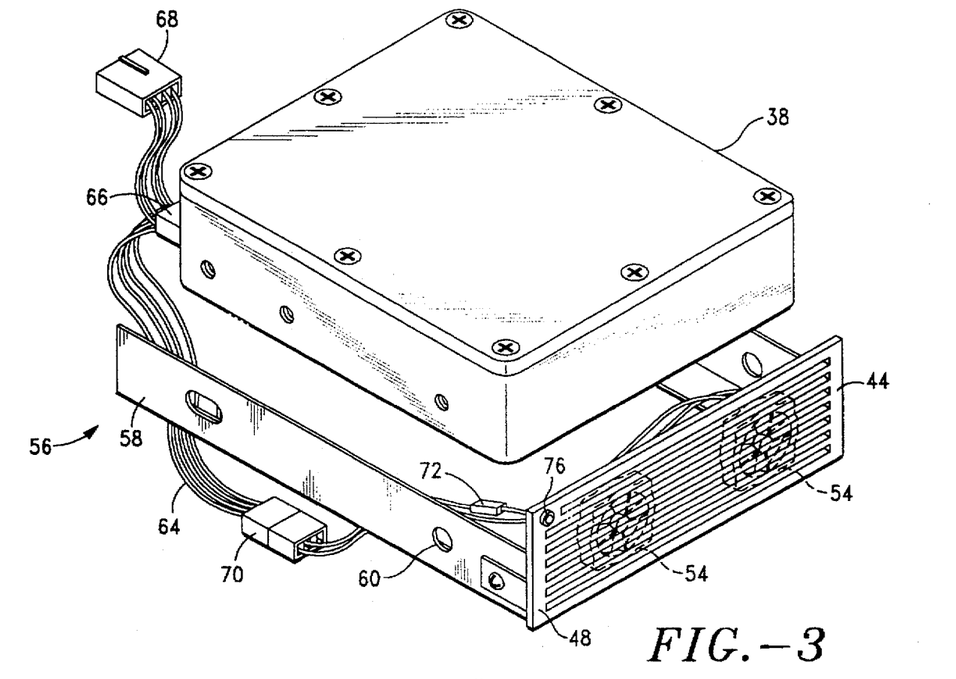
FIG. 3 is a perspective view of a memory storage device mounting kit of FIG. 1.

With particular reference to FIG. 3 there is shown a memory storage device mounting kit generally designated with the reference numeral 56 and a hard disk drive 38. The kit 56 includes a frame 58, the bezel 44 and at least one fan 54.

The frame 58 is configured for mounting the hard disk drive 38 within a memory storage device housing. The frame 58 bolts to the bezel 44. The frame 58 includes mounting holes 60 for attachment to the hard disk drive 38. Although the frame 58 bolts to the bezel 44, it can be appreciated that the frame 58 may also be attached to the bezel 44 in a variety of ways or, the frame 58 may be formed integral with the bezel 44 in accordance with the present invention.

The bezel fan 54 includes a power chord adapter 64. The adapter 64 includes three ends. The first end 66 attaches to the hard disk drive 38. The second end 68 is attachable to a power supply. The third end 70 electronically attaches to at least one fan 54.

In one embodiment, a current sensor 72 and an indicator 74 electronically attach with the bezel fan 54. The current sensor 72 attaches with the power chord adapter 64 to monitor current flowing to the bezel fan 54. The indicator 74 attaches to the bezel 44 to indicate when the current flowing through the power chord adapter 64 exceeds a predetermined range. Preferably, the indicator 74 includes a LED light 76 which extends through the face 48 of the bezel 44.

The current sensor 72 illuminates the LED 76 when the fan 54 draws current beyond a predetermined range. Illumination of the LED indicates when the fan is malfunctioning e.g. when the fan has a short. Illumination of the LED also indicates when the fan 54 is overworked such as when the fan 54 is plugged with dust. In an embodiment where the bezel includes an air filter (FIG. 4), the LED 76 illuminates when the air filter is plugged and needs to be changed.

Although a current sensor is shown for sensing the operation of the bezel fan, a variety of sensor types and methods may be used to sense such operation. For example, a voltage sensor and appropriate circuitry may be used.

Figure 4:
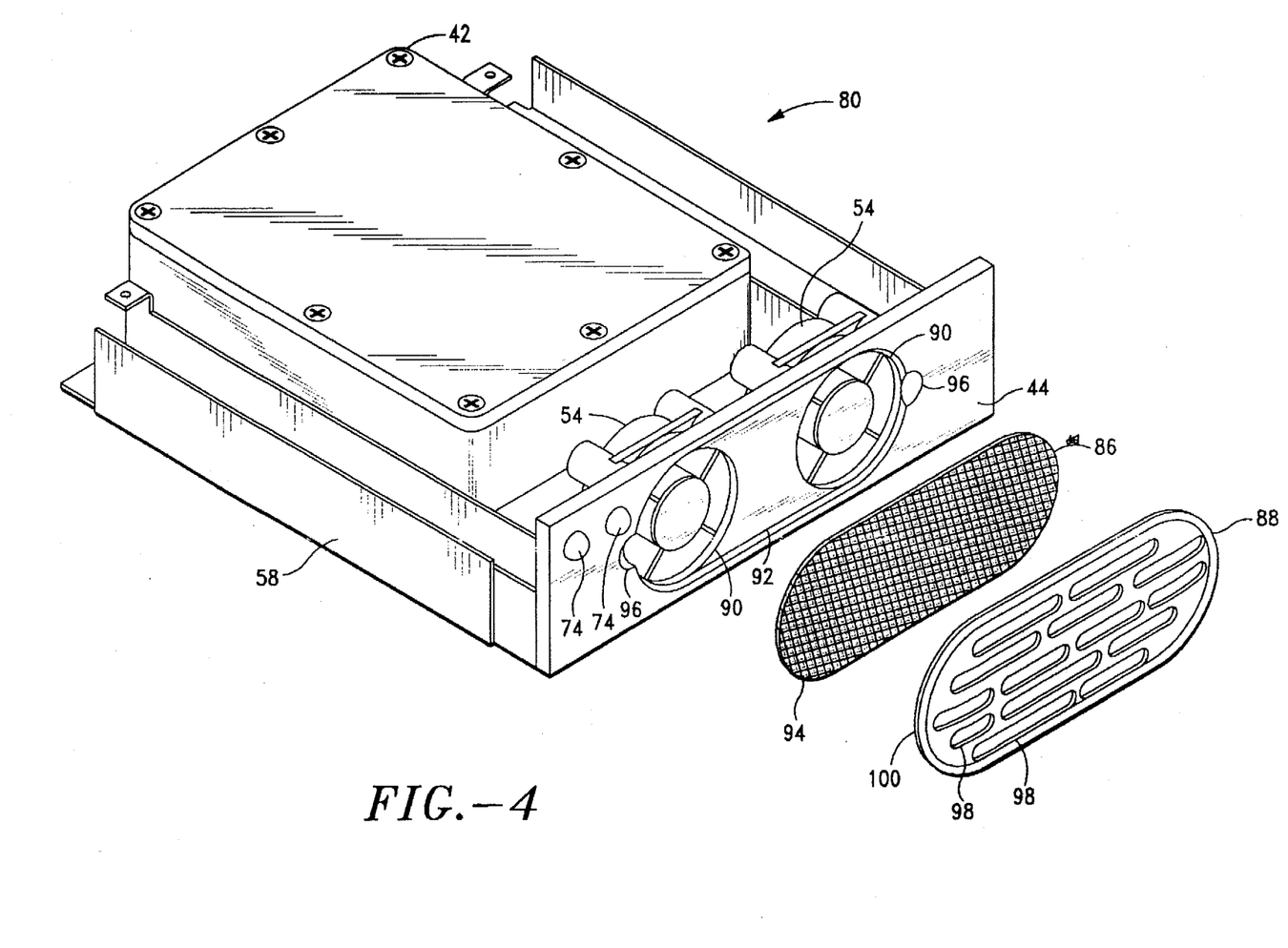
FIG. 4 is a perspective view an embodiment of the memory storage device mounting kit of FIG. 3.

With particular reference to FIG. 4 there is shown a memory storage device mounting kit generally designated with the reference numeral 80. The kit includes a bezel 82 having two indicators 74, 86, two fans 54, an air filter 84 and a cover 88.

The indicator 86 includes a LED which illuminates to indicate operation of the memory storage device 42. The indicator 74 illuminates to indicate fan fault.

The bezel 44 includes a pair of fan openings 90 and a recessed portion 92. Each fan 54 inserts into a respective fan opening 90. The recessed portion 92 surrounds the fan openings 90. The recessed portion 92 is configured for receiving the air filter 86. The recessed portion 92 and air filter 86 are oval shaped. It can be appreciated that although the recessed portion 92 and the air filter 86 are shown oval shaped, any of a variety of shapes can be used in accordance with the present invention.

The air filter 86 has a periphery 94. The periphery 94 of the air filter seats within the recessed portion 92 to maximize filtration of air entering the bezel 44.

The bezel 44 includes a finger slot 96 located at each end of the recessed portion 92. The finger slots 96 enable an operator to grasp the periphery of the air filter 84 and remove the air filter 84 when the air filter 84 seats within the recessed portion 92. The finger slots 96 ease removal and replacement of the air filter 84 and thereby minimize the amount of dust and particles which may escape from the air filter 84 when the air filter 84 is removed from the bezel 44.

The cover 88 is oval shaped to seat within the recessed portion 92 of the bezel 82. When the cover 88 seats within the recessed portion 92, the cover holds the air filter 86 in place over the fan openings 90. The cover 88 has a plurality of vents 98 and an oval periphery 100. The vents 98 are within 2–5 mm in width. The cover 88 is convex. The convex shape of the cover 88 in combination with the size of the size of the vents 98 cooperate to minimize interference with air flow through the air filter 86. The cover 88 protects the air filter 86 from damage such as damage due to impact. The cover 88 also holds the air filter 86 with a press fit on the bezel 44.

Figure 5:
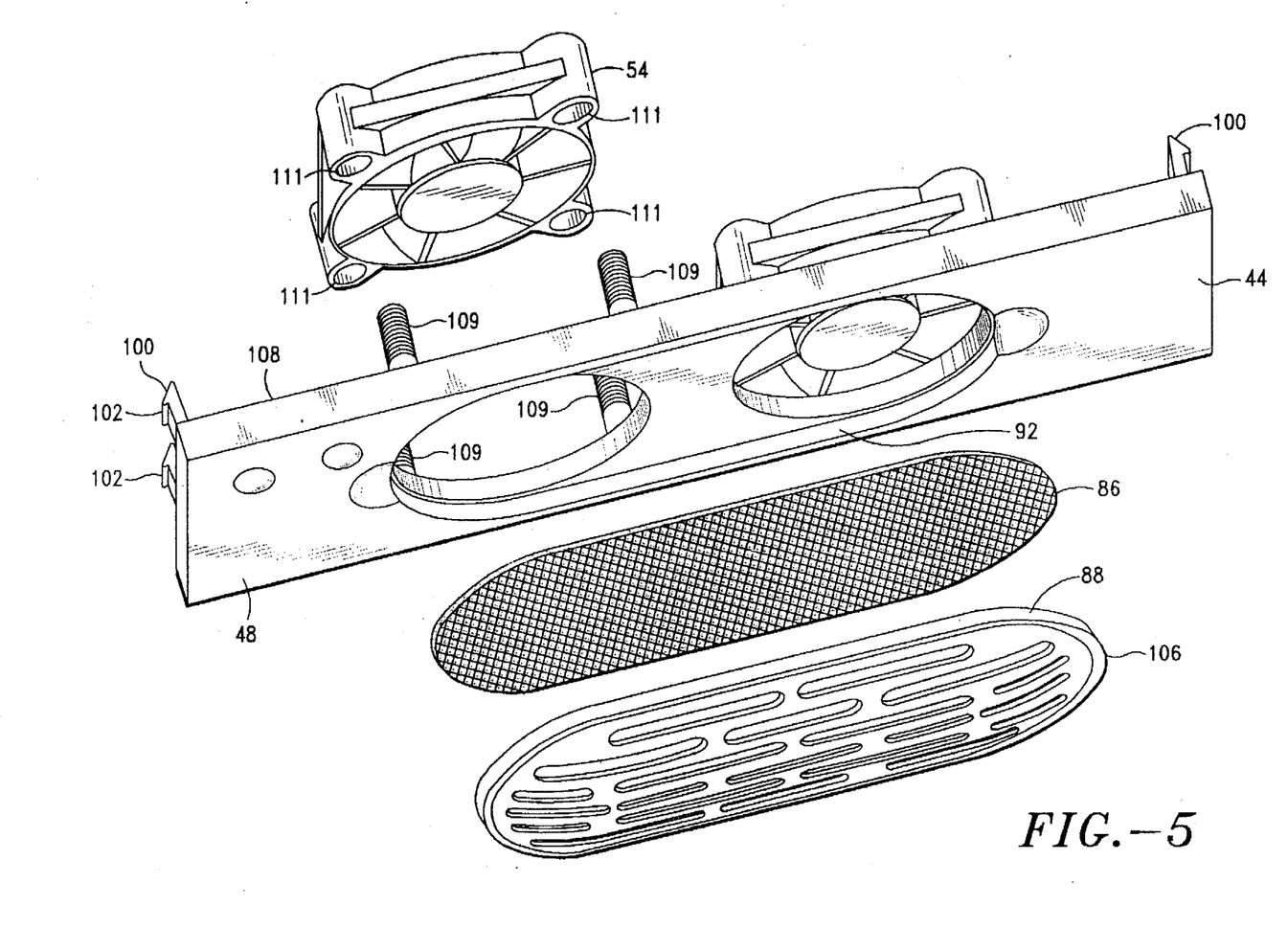
FIG. 5 is an exploded perspective view of an embodiment of the bezel of FIG. 2.

With particular reference to FIG. 5, there is shown the bezel 44 of FIG. 4. The bezel 44 includes end snaps 100. The end snaps 100 include a hooked end 102. The end snaps 100 flex to snap fit the bezel 44 with a memory storage device housing. The end snaps 100 removeably hold the bezel with a memory storage device housing to enable access to a memory storage device and to the fan 54.

The cover 88 has a gasket 106. The gasket 106 surrounds the cover 88 and seals the cover 88 within the recessed portion 92 of the bezel. The gasket 106 holds the cover 88 in place when the cover 88 seals within the recessed portion 92.

The bezel 44 has a rear portion 108. The rear portion 108 includes pins 109 arranged in a square. The fan 54 includes four holes 111. The holes 111 press fit onto the pins 109 to removeably attach the fan 54 with the bezel 44.

It can be appreciated that although the fan 54 mounts on the rear portion 108 of the bezel. The fan 54 may also mount on the front portion of the bezel and may be formed integral with the bezel in accordance with the present invention.

Figure 6:
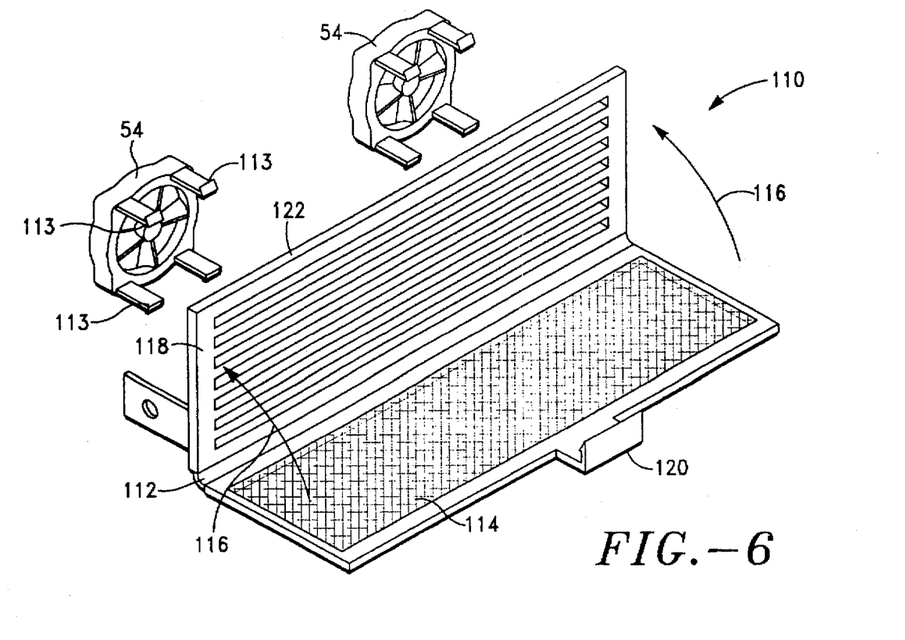
FIG. 6 is a perspective view of an embodiment of a bezel of FIG. 2.

With particular reference to FIG. 6 there is shown a bezel in accordance with the present invention, generally designated with the reference numeral 110. The bezel 110 has vents 118, a hinge 112 and an air filter 114. The hinge 112 rotatably attaches the air filter 114 to the bezel 110 to enable the air filter 114 to selectively cover the bezel 110. The air filter 114 moves between an open and closed position. When the air filter 114 is in an open position as shown, the air filter 114 may be cleaned. The air filter 114 rotates in the direction of the arrows 116 to a closed position wherein the air filter 114 lies against the bezel 110.

The air filter 114 has a latch 120. The bezel 114 has a top edge 122. When the air filter 114 rotates into the closed position, the latch 114 snaps with the top edge 122. In the closed position, the air filter 114 covers a portion of the bezel 114. As shown, the air filter 114 is sized in the shape of the bezel 114 so that the air filter 114 fully covers the bezel 114 and the vents 118 to filter air which passes through the bezel 114.

In one embodiment, the bezel 114 has an area within the range of 7–20 in$^2$ to cover a 5¼" memory storage device bay. A 5¼" memory storage device bay is typically sized slightly larger than 5¼" wide to hold a 5¼" memory storage device. The area of the bezel 114 can be varied to accommodate both low profile and high profile memory storage devices.

In another embodiment, the bezel 114 has an area within the range of 4–7in$^2$ to cover a 3½" memory storage device bay. A 3½" memory storage device bay is sized slightly larger than 3½" wide to hold a 3½" memory storage device. It can be appreciated that as memory storage device sizes change in response to new standards that the bezel size may be adapted accordingly, The fans 54 include latches 113. The vents 118 are sized to receive the latches 113 of each fan 54. The latches 113 snap within the vents 118 to hold each fan 54 with the bezel 110.

Figure 7:
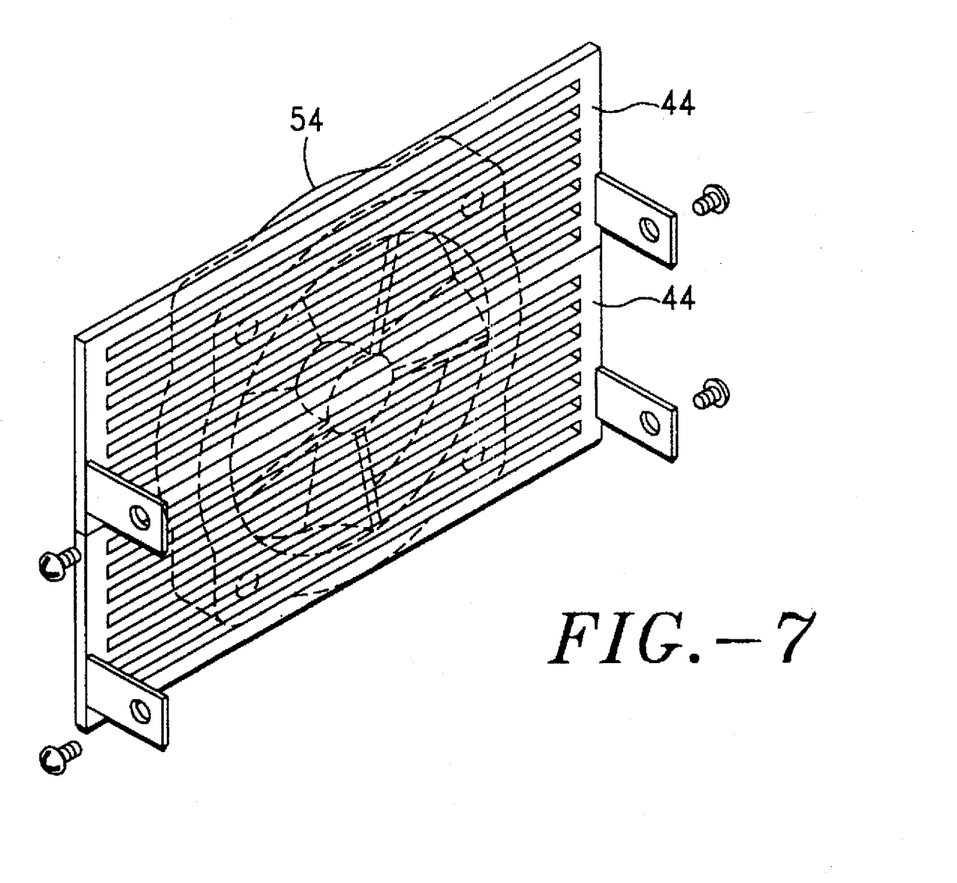
FIG. 7 is a rear perspective view of an embodiment of a bezel in accordance with the present invention.

With particular reference to FIG. 7 there is shown a fan 54 attached to a pair of bezels 44. The fan 54 holds the bezels 44 together in alignment. The bezels 44 are attachable to the memory storage device housing to cover two memory storage device bays.

Figure 8:
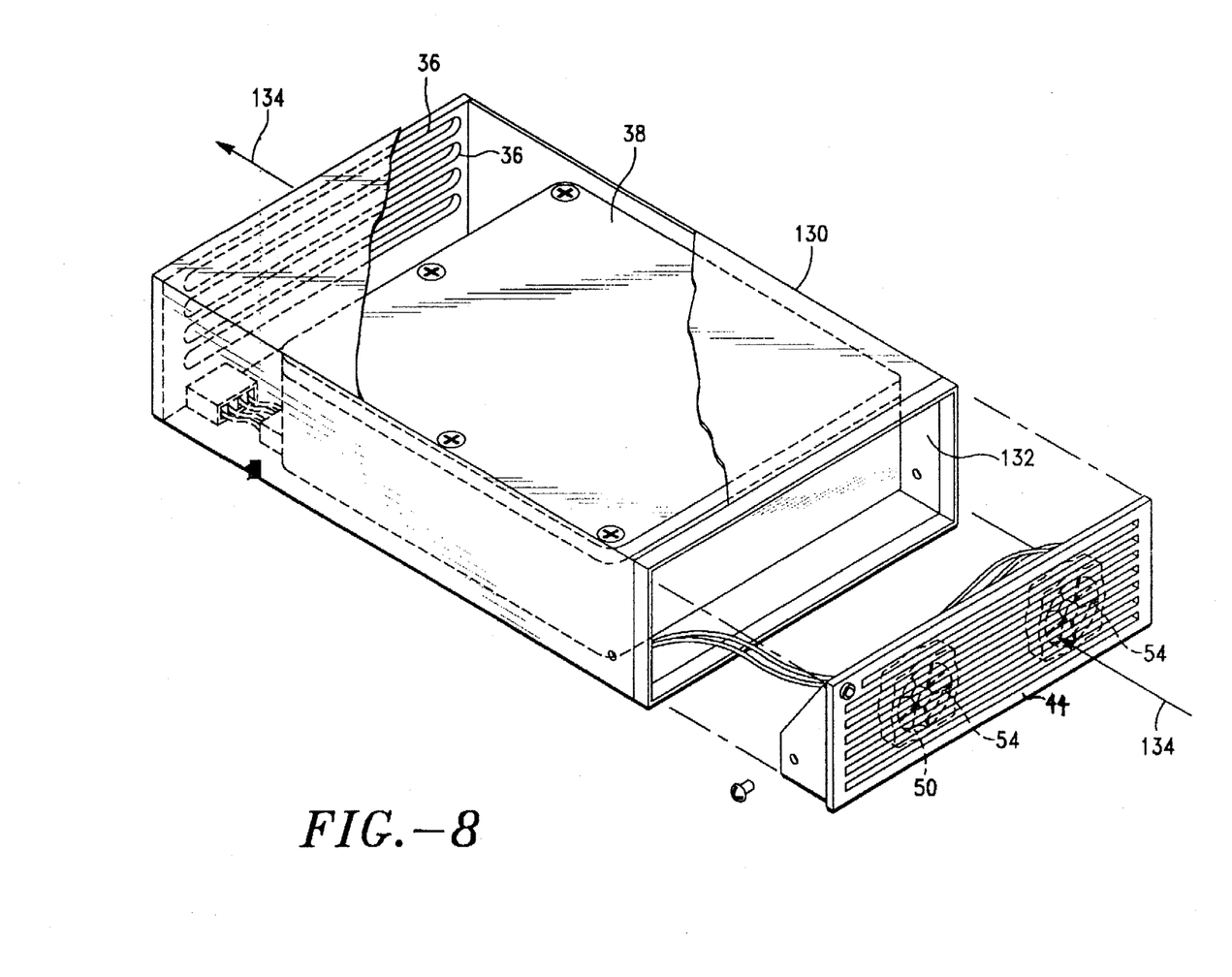
FIG. 8 is a perspective view of an external type memory storage device housing in accordance with the present invention.

With particular reference to FIG. 8, there is shown an external type memory storage device housing 130 and a hard disk drive 38. The external type housing 130 has an interior which defines a memory storage device bay 132 and vents 36. A bezel 44 attaches to the housing 130 and covers the bay 132. The fan 54 pumps air across the hard disk drive 38 and out of the housing 130 in the direction of the arrows 134. Accordingly, the fan 54 cools the hard disk drive 38.

The external type housing 130 is connectable e.g. via a daisy chain to a SCSI bus of a SCSI memory storage system. Accordingly multiple housings 130 may be daisy chained such as commonly accomplished in RAID systems.

While the foregoing detailed description has described various embodiments of the invention, it is to be understood that the above description is illustrative only and not limiting of the disclosed invention. Particularly, the specific details of the geometry of bezel may be altered from the rectangular configuration shown. Also, the way the fans mount on the bezel and the way the bezel mounts to the housing may be modified. Accordingly, the invention is to be limited only by the claims set forth below.

What is claimed is:

1. A bezel connectable with the bay of a memory storage device housing, comprising:

a face having an area within the range of 2–10in$^2$ for covering the memory storage device bay;

a fan;

a means for attaching a fan to the face;

whereby, when a fan mounts on the face and the bezel mounts on the housing, the fan circulates air through the housing to cool the housing.

2. An apparatus as set forth in claim 1, wherein the bezel includes an air filter, the air filter covers a portion of the bezel.

3. An apparatus as set forth in claim 1, wherein the bezel includes an air filter, the air filter removeably attaches over a portion of the bezel.

4. An apparatus as set forth in claim 1, wherein the bezel includes an air filter, the air filter rotatably mounts on the bezel to selectively cover a portion of the bezel.

5. An apparatus as set forth in claim 1, wherein the bezel has a face with an area within the range of 7–10 in$^2$ to cover a 5¼" memory storage device bay.

6. An apparatus as set forth in claim 1, wherein the bezel has a face with an area within the range of 4–7in$^2$ to cover a 3½" memory storage device bay.

7. A memory storage device mounting kit, comprising:
   frame for mounting a memory storage device within a memory storage device housing;
   a bezel being attachable with the frame;
   a fan attachable to the bezel to direct air across a memory storage device;
   whereby, when a memory storage device mounts on the frame, the fan directs air across the memory storage device and cools the memory storage device.

8. A kit as set forth in claim 7, wherein a hard disk drive mounts on the frame.

9. A kit as set forth in claim 7, wherein the bezel includes a recessed portion, an air filter and a cover, the air filter and cover being configured to seat within the recessed portion, whereby when the air filter covers the recessed portion and the cover seats within the recessed portion, the cover holds the air filter.

10. A kit as set forth in claim 7, wherein the bezel includes an air filter and a recessed portion having a periphery and finger slots, the finger slots being located along the periphery of the recessed portion to facilitate removal of the air filter.

11. A kit as set forth in claim 7, wherein the bezel includes an air filter and vented cover removeably attached to the bezel, the shape of the cover coincides with the shape of the air filter to enable the cover to hold the air filter with the bezel.

12. A kit as set forth in claim 7, wherein a current sensor electronically attaches with the fan to monitor operation of the fan.

13. A kit as set forth in claim 12, wherein an indicator attaches to the bezel to indicate when the current exceeds a predetermined range.

14. A kit as set forth in claim 12, wherein an indicator attaches to the bezel to indicate when the current exceeds a predetermined range, the indicator includes a LED.

15. A memory storage device housing, comprising:
   a memory storage device bay with an opening;
   a facade means being attachable to the bay for covering the opening, the facade means including a vent;
   a mount means attached to the facade means to enable a fan to attach to the facade means; and
   a fan attached to the mount means,
   whereby, the fan convectively cools the memory storage device bay.

16. An apparatus as set forth in claim 15, wherein the facade means includes a rectangular bezel.

17. An apparatus as set forth in claim 15, wherein the facade means includes clips which removeably attach the facade means to the housing.

18. An apparatus as set forth in claim 15, wherein the mount means include clips, the facade means includes grooves, the clips hold the fan with the grooves.

19. An apparatus as set forth in claim 15, wherein the mount means includes pins, the fan has holes, the pins press fit within the holes to hold the fan with the facade means.

20. An apparatus as set forth in claim 15, wherein the facade means includes a pair of rails, the rails attach within the memory storage device bay to hold a memory storage device.

* * * * *